(12) United States Patent
Tkachev et al.

(10) Patent No.: US 7,477,175 B1
(45) Date of Patent: Jan. 13, 2009

(54) SIGMA DELTA ANALOG TO DIGITAL CONVERTER AND A METHOD FOR ANALOG TO DIGITAL CONVERSION

(75) Inventors: Vadim Tkachev, Rehovot (IL); Vladimir Koifman, Rishon Le'Zion (IL)

(73) Assignee: Advasense Technologies (2004) Ltd, Raanana (IL)

( * ) Notice: Subject to any disclaimer, the term of this patent is extended or adjusted under 35 U.S.C. 154(b) by 0 days.

(21) Appl. No.: 11/877,705

(22) Filed: Oct. 24, 2007

(51) Int. Cl.
*H03M 3/00* (2006.01)
(52) U.S. Cl. .................................. 341/143; 341/155
(58) Field of Classification Search .......... 341/130–150
See application file for complete search history.

(56) References Cited

U.S. PATENT DOCUMENTS

| | | | |
|---|---|---|---|
| 4,375,059 A * | 2/1983 | Schlig | 341/162 |
| 4,490,653 A | 12/1984 | Olmstead | |
| 4,596,948 A | 6/1986 | Wall | |
| 5,973,522 A | 10/1999 | Coy et al. | |
| 6,268,815 B1 * | 7/2001 | Gustavsson et al. | 341/143 |
| 6,275,178 B1 * | 8/2001 | Koifman et al. | 341/143 |
| 6,339,349 B1 | 1/2002 | Rajagopalan | |
| 6,614,371 B2 * | 9/2003 | Zhang | 341/101 |
| 6,614,374 B1 * | 9/2003 | Gustavsson et al. | 341/143 |
| 6,653,967 B2 * | 11/2003 | Hamashita | 341/172 |
| 6,838,916 B2 | 1/2005 | Premont et al. | |

FOREIGN PATENT DOCUMENTS

GB 2421375 A 6/2006

* cited by examiner

*Primary Examiner*—Lam T Mai
(74) *Attorney, Agent, or Firm*—Reches Patents

(57) ABSTRACT

A device that includes: (i) an input node, adapted to receive an analog input current; (ii) an integrating capacitor; wherein a first end of the integrating capacitor is connected to the input node; (iii) a quantizer that comprises a data input, a clock input and an output; wherein the data input is connected to the input node, the clock input receives a jittered clock signal and the output controls a first switch in response to a voltage level of the input node; (iv) a fast charge transfer circuit, for transferring to the integrating capacitor a fixed charge if a first switch is closed; wherein the fixed charge is being transferred during a charge transfer period that is substantially shorter than a minimal clock signal phase of the jittered clock signal; and (v) a first switch, connected between the input node and the fast charge transfer circuit.

21 Claims, 5 Drawing Sheets providing an analog input current to an integrating capacitor via an input node. The analog input current can represent a light detected by an analog pixel. 310 generating a digital signal that controls a first switch that is connected between the input node and a fast charge transfer circuit; wherein the generating is responsive to a voltage level of the input node being sampled by a quantizer that is fed by a jittered clock signal. 320 transferring, by a fast charge transfer circuit and to the integrating capacitor, a fixed charge if the first switch is closed; wherein the transferring of the fixed charge occurs during a charge transfer period that is substantially shorter than a minimal clock signal phase of the jittered clock signal. The charge transfer period can be shorter than a fraction (for example a half) of the minimal clock signal phase of the jittered clock signal. 330

Outputting the digital signal. 340

300   Figure 4

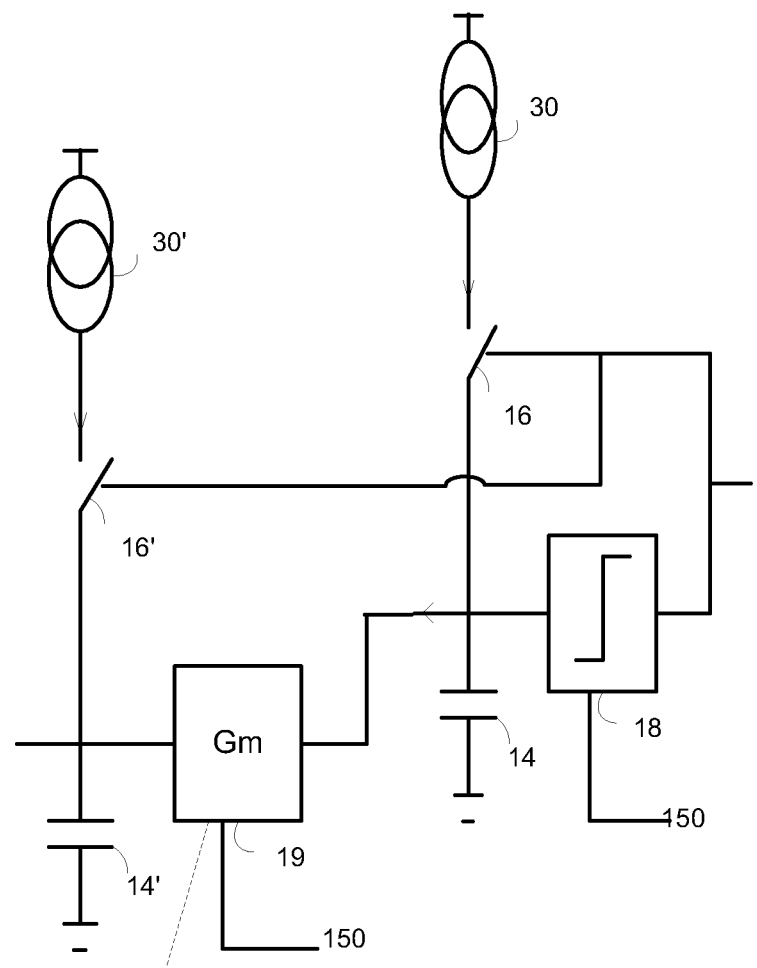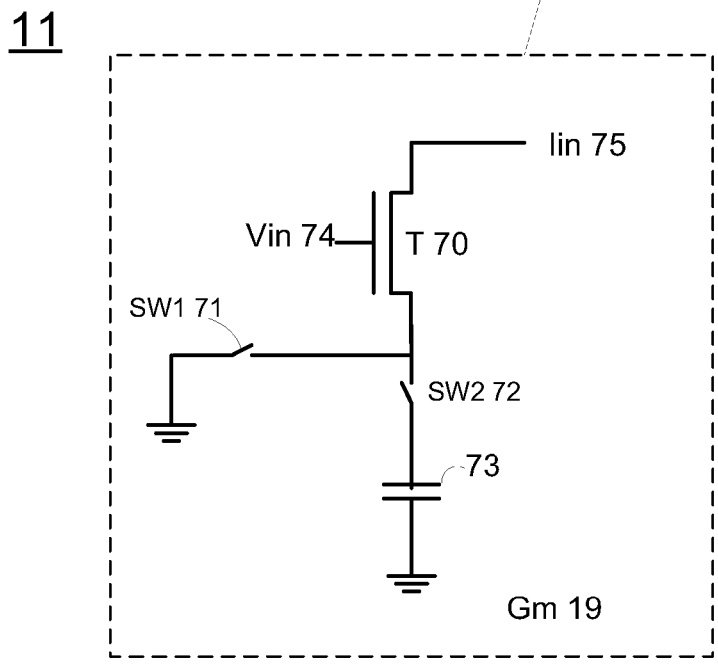
Figure 5

SIGMA DELTA ANALOG TO DIGITAL CONVERTER AND A METHOD FOR ANALOG TO DIGITAL CONVERSION

FIELD OF THE INVENTION

The invention relates to an analog to digital converter and a method for analog to digital conversion.

BACKGROUND OF THE INVENTION

Digital cameras include a two-dimensional photo-detector array. A single pixel can include one or more photo-detectors as well as multiple transistors. Typical photo-detectors include photodiodes, phototransistors, photo-gates, hole accumulation diodes, pinned diodes, avalanche diodes, buried accumulation and transfer layer devices.

Readout circuits read the analog signal (current or voltage) outputted from the pixel. Typically, each column of pixels is connected to a column readout circuit. The column readout circuit includes an analog to digital converter or is connected to an analog to digital converters.

Many vendors utilize sigma delta analog to digital converters. FIG. 1 illustrates a prior art analog to digital converter 10. Analog to digital converter 10 includes an input node 12, integrating capacitor Ci 14, quantizer 18, switch 16 and reference current source 30. Switch 16 is controlled by quantizer 18 and is connected between reference current source 30 and integrating capacitor Ci 14. Integrating capacitor Ci 14 is also connected to input node 12 and to the input of quantizer 18. Quantizer 18 samples the voltage on integrating capacitor Ci 14 and closes switch 16 (thus connecting reference current source 30 and integrating capacitor Ci 14) when the sampled voltage is below a threshold. A control signal sent by quantizer 18 to switch 16 is the output signal of analog to digital converter.

Integrating capacitor Ci 14 is drained by input analog current Iin 22 and selectively charged by reference current Iref 32. Iin 22 represents the analog signal of a pixel that should be read by a column readout circuit.

Quantizer 18 samples the voltage on integrating capacitor Ci 14 in response to a reception of a jittered clock signal 150.

The reference current source 30 provides an ideally stable reference current to integrating capacitor Ci 14. The charge provided to the integrating capacitor Ci 14 depends upon the value of Iref 32 and the integration period. The integration period substantially equals the period of jittered clock signal 150.

Large photo-detector arrays typically have more than one thousand columns, and accordingly are connected to more than a thousand analog to digital converters. Due to clock signal jitter different analog to digital converters have different integrating periods and accordingly provide non-uniform readout results.

There is a growing need to provide analog to digital converters that are more tolerant to clock signal jitters.

Analog to digital converters are subjected to various noises and phenomena that can affect their performance. Analog to digital converters and especially those which are included in devices that include multiple analog to digital converters are susceptible to IR drops. The IR drops effect analog to digital converters that include (or are connected to) continuous current sources. IR drops can be responsive to current drained by different analog to digital converters that operate concurrently. Gain mismatches and cross-talks can occur in devices that include multiple analog to digital converters.

There is a growing need to provide a more robust analog to digital converters.

SUMMARY OF THE INVENTION

A device that includes: an input node, adapted to receive an analog input current; an integrating capacitor; wherein a first end of the integrating capacitor is connected to the input node; a quantizer that includes a data input, a clock input and an output; wherein the data input is connected to the input node, the clock input receives a jittered clock signal and the output controls a first switch in response to a voltage level of the input node; a fast charge transfer circuit, for transferring to the integrating capacitor a fixed charge if a first switch is closed; wherein the fixed charge is being transferred during a charge transfer period that is substantially shorter than a minimal clock signal phase of the jittered clock signal; and a first switch, connected between the input node and the fast charge transfer circuit.

A method for analog to digital conversion, the method includes: (i) providing an analog input current to an integrating capacitor via an input node; (ii) generating a digital signal that controls a first switch that is connected between the input node and a fast charge transfer circuit; wherein the generating is responsive to a voltage level of the input node being sampled by a quantizer that is fed by a jittered clock signal; (iii) transferring, by a fast charge transfer circuit and to the integrating capacitor, a fixed charge if the first switch is closed; wherein the transferring of the fixed charge occurs during a charge transfer period that is substantially shorter than a minimal clock signal phase of the jittered clock signal; and (iv) outputting the digital signal.

BRIEF DESCRIPTION OF THE DRAWINGS

The present invention will be understood and appreciated more fully from the following detailed description taken in conjunction with the drawings in which:

FIG. 4 illustrates a method for analog to digital conversion, according to an embodiment of the invention; and FIG. 5 illustrates an analog to digital converter according to an embodiment of the invention.

DETAILED DESCRIPTION OF THE DRAWINGS

Conveniently, performing a fast current transfer obviates IR drop issues, jitter clock problems and reduces the susceptibility of the analog to digital converter to various types of noises.

Figure 1:
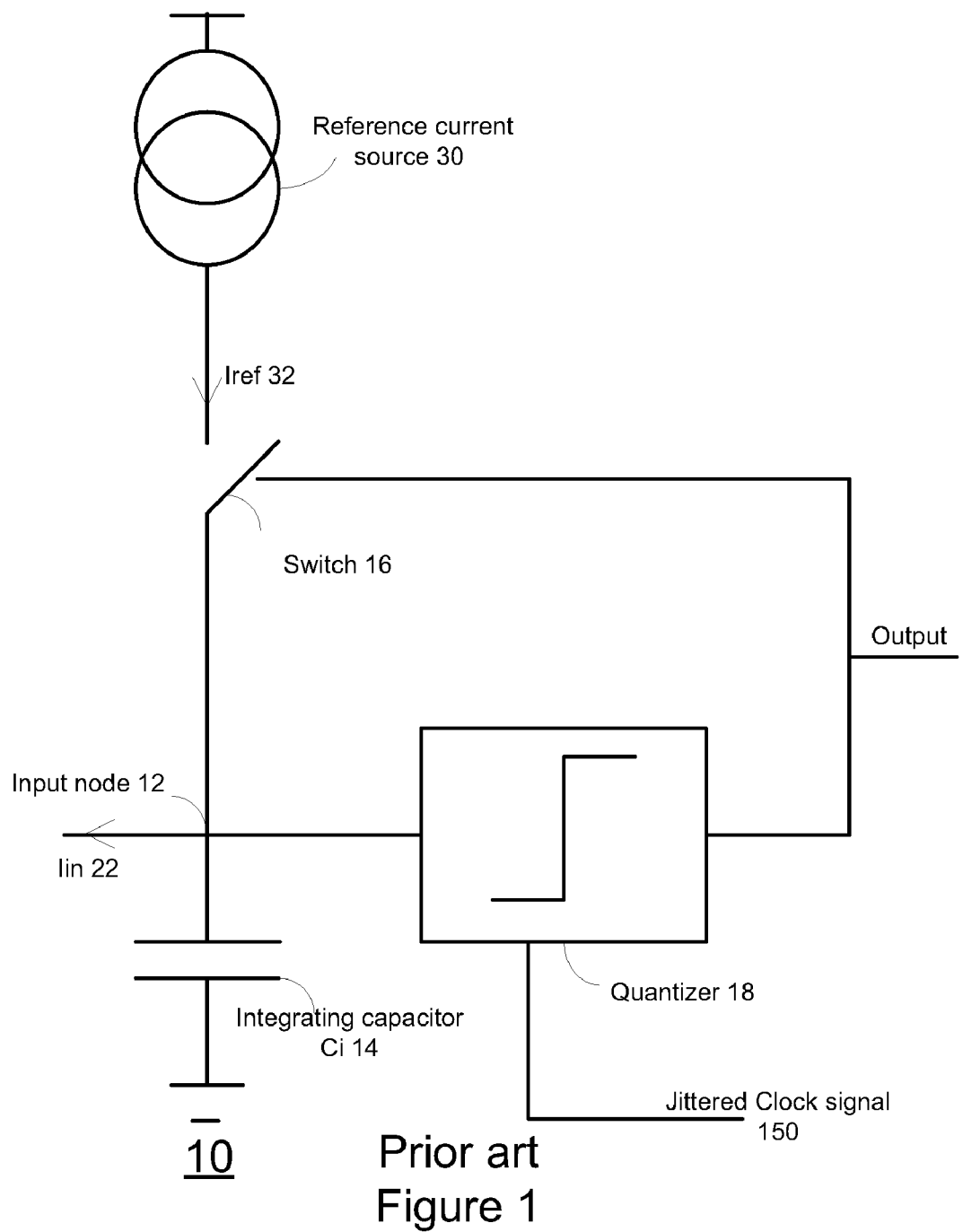
FIG. 1 illustrates a prior art analog to digital converter.
Figure 2:
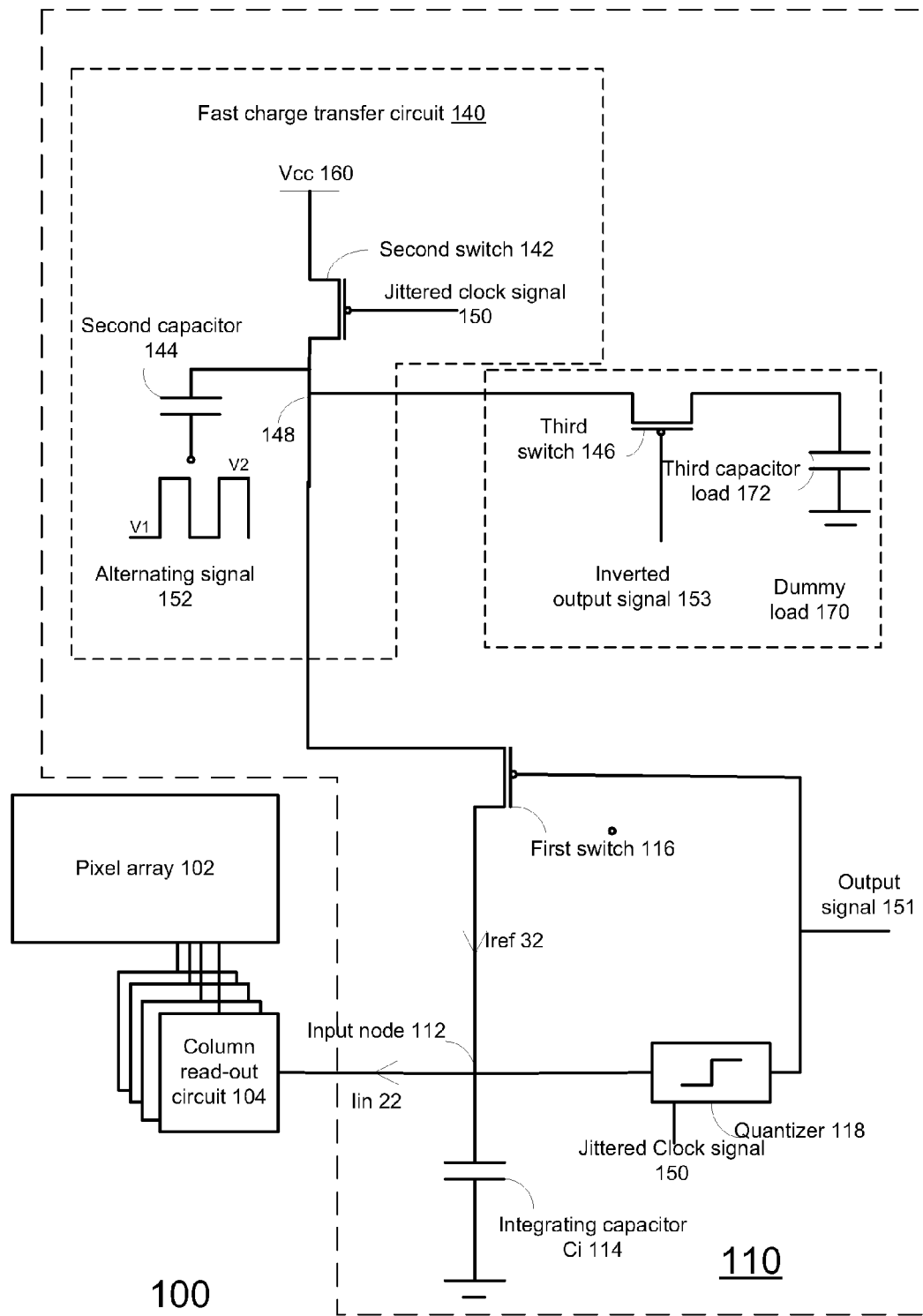
FIG. 2 illustrates a device according to various embodiments of the invention.

FIG. 2 illustrates device 100 according to an embodiment of the invention.

Device 100 includes array of pixels 102, wherein each group of pixels (for example each pixel column) is connected to a readout circuit. Multiple column readout circuits are connected to pixel array 102, one of which is denoted 104. Column readout circuit 104 is connected to analog to digital converter (ADC) 110. ADC 110 is conveniently a single bit, first order, sigma delta ADC, but this is not necessarily so. The other column readout circuits are also connected to analog to digital converters but are not illustrated for simplicity of explanation.

ADC 110 includes input node 112, integrating capacitor Ci 114, quantizer 118, fast charge transfer circuit 140 and first switch 116.

Input node 112 receives an analog input current that may represent a light detected by an analog pixel of pixel array 102.

A first end of integrating capacitor Ci 114 is connected to input node 112 and its second end is grounded.

Quantizer (also referred to comparator) 118 includes a data input, a clock input and an output, the data input is connected to input node 112, the clock input receives jittered clock signal 150 and the output controls first switch 116 in response to a voltage level of input node 112. The digital output signal that controls first switch 116 is also provided as a digital output of ADC 110.

Fast charge transfer circuit 140 transfers to integrating capacitor Ci 114 a fixed charge if first switch 116 is closed. The fixed charge is being transferred during a charge transfer period that is substantially shorter than a minimal clock signal phase of jittered clock signal 150.

First switch 116 is connected between input node 112 and fast charge transfer circuit 140.

Conveniently, fast charge transfer circuit 140 includes second capacitor 144 that is connected to second switch 142. As illustrated below, second switch 142 received jittered clock signal 150 and is repetitively opened (during a first phase of jittered clock signal 150) and closed (during a second phase of jittered clock signal 150) and second capacitor 144 receives an alternating signal 152 in synchronism with the jittered clock signal.

A first end of second capacitor 144 receives alternating signal 152 that alternates in synchronism with jittered clock signal 150. During a first phase of jittered clock signal 150 the level of alternating signal 152 is low (this level is denoted V1) and during a second phase of jittered clock signal 150 the level of alternating signal 152 is high (this level is denoted V2).

A second end of second capacitor 144 is connected to intermediate node 148 that is located between first switch 116 and second switch 142. Second switch 142 is connected between intermediate node 148 and voltage supply 160. Second switch 142 is closed such as to connect second capacitor 144 to voltage supply 160 during a first phase of jittered clock signal 150.

According to an embodiment of an invention fast charge transfer circuit 140 sends to integration capacitor Ci 114, immediately after a transition to the second phase of jittered clock signal 150 and if first switch 116 is closed, a fixed charge Q that is responsive to the high level of alternating signal 152, to the low level of the alternating signal 152, and to the capacitance (C) of second capacitor C 144.

In order to maintain power consumption and maintain the same load on the alternating voltage source that provides alternating signal 152 regardless of whether first switch 116 is opened during the second phase of jittered clock signal 150, device 100 includes dummy load 170 that is connected to intermediate node 148 if first switch 116 is open. Dummy load 170 includes third capacitor load 172 that is connected to third switch 146. Third switch 146 is closed (thus connecting third capacitor 172 to intermediate node 148 during the second phase of jittered clock signal and if first switch 116 is open.

Conveniently, an impedance of dummy load 170 is substantially equal to an impedance of input node 112.

Figure 3:
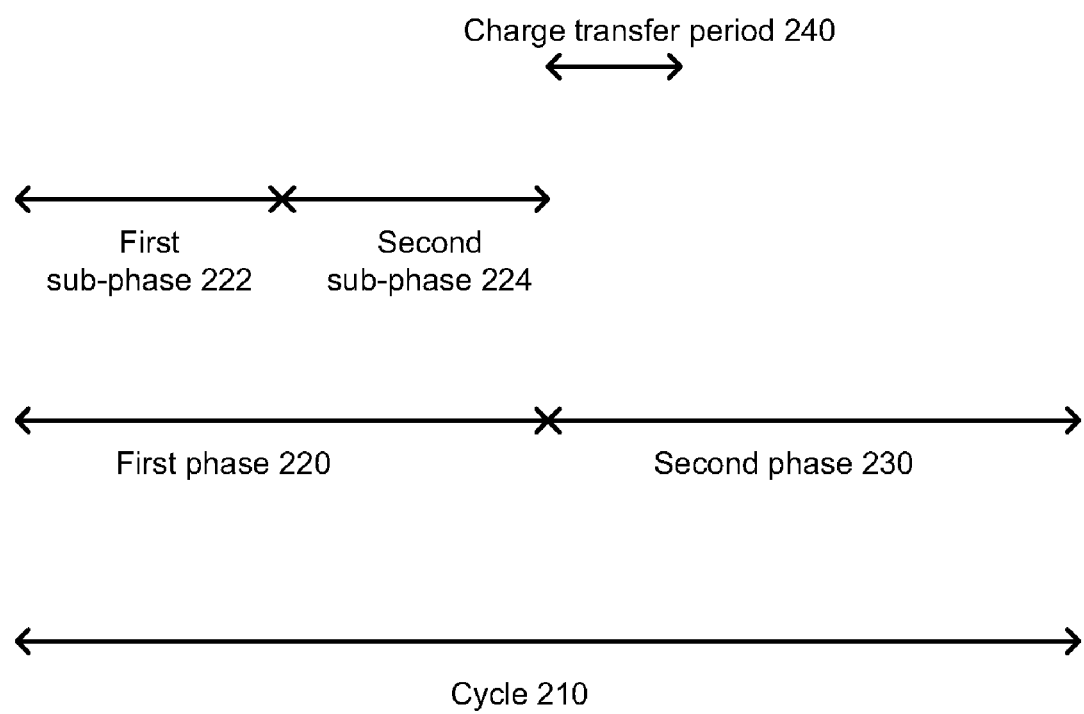
FIG. 3 is a timing diagram of an analog to digital conversion process, according to an embodiment of the invention.

FIG. 3 is a timing diagram 200 that illustrates the operation of ADC 110 a cycle 210 of jittered clock signal 150. Cycle 210 includes a first phase 220 and a second phase 230. First phase 220 a first sub-phase 222 and a second sub-phase 224.

During first sub-phase 222 first switch 116 is open, second switch 142 is closed, integrating capacitor Ci 114 is discharged by the analog input current, second capacitor 144 receives on one end a low level signal (V1) and on the other end receives a voltage supply (Vcc) from voltage supply 160 and quantizer 118 is reset.

During second sub-phase 224 quantizer 118 samples the voltage of input node 112 (which is the voltage drop on integrating capacitor Ci 114) and decides whether to open or close first switch 116 during second phase 230. First switch 116 is closed if the sampled voltage drop on integrating capacitor Ci 114 is below a predefined threshold level.

At the beginning of second phase 230 (immediately after a transition between first phase 220 and second phase 230) second switch 142 is disconnected, second capacitor 144 receives on one end V2 thus the voltage upon second capacitor 144 instantly changes from (Vcc-V1) to (Vinter-V2). Vinter is the voltage at intermediate node 148.

Assuming that quantizer 118 decides to close first switch 116 then this voltage change is immediately transferred to integrating capacitor Ci 114, which is charged by a fixed charge Q of $[(Vcc-V1)-(Vinter-V2)]*C$ during a charge transfer period 240 that is substantially shorter than a minimal clock signal phase (either first or second phases 220 or 230) of jittered clock signal 150.

If quantizer 118 decides not to close first switch 116 then this charge can be provided to dummy load 170, if such dummy load exists.

FIG. 4 illustrates method 300 for analog to digital conversion.

Method 300 starts by stage 310 of providing an analog input current to an integrating capacitor via an input node. The analog input current can represent a light detected by an analog pixel.

Stage 310 is followed by stage 320 of generating a digital signal that controls a first switch that is connected between the input node and a fast charge transfer circuit; wherein the generating is responsive to a voltage level of the input node being sampled by a quantizer that is fed by a jittered clock signal.

Stage 320 is followed by stage 330 of transferring, by a fast charge transfer circuit and to the integrating capacitor, a fixed charge if the first switch is closed; wherein the transferring of the fixed charge occurs during a charge transfer period that is substantially shorter than a minimal clock signal phase of the jittered clock signal. The charge transfer period can be shorter than a fraction (for example a half) of the minimal clock signal phase of the jittered clock signal.

Stage 330 is followed by stage 340 of outputting the digital signal.

It is noted that multiple repetitions of stages 310-340 can provide a sigma delta analog to digital conversion process.

Conveniently, method 300 is implemented by an analog to digital circuit that has two major operational phases that occur during the first and second phases of a jittered clock signal.

Accordingly, method 300 further includes repetitively closing and opening in synchronism to the jittered clock signal, a second switch of the fast charge transfer circuit; and receiving an alternating signal by a second capacitor of the fast charge transfer circuit; wherein the alternating signal alternates in synchronism with the jittered clock signal.

Conveniently, stage 330 of transferring is preceded by charging a second capacitor of the fast charge transfer circuit to a voltage level determined by a certain level of the alternating signal and by a voltage supply connected to the second capacitor during the charging. This occurs during a first phase of the jittered clock cycle. The alternating signal can alternate between a high level provided during a first phase of the jittered clock signal and a low level provided during a second phase of the jittered clock signal.

According to an embodiment of the invention stage 330 occurs if the first switch is closed and immediately after a transition to the second phase of the jittered clock. The charge being transferred is responsive to the high level of the alternating signal, to the low level of the alternating signal and to the capacitance of the integrating transistor.

Conveniently, the first switch is a transistor and wherein the receiving of the an alternating signal includes receiving an alternating signal that has a high level that substantially equals a difference between a gate voltage of the transistor and a threshold voltage of the transistor.

As illustrated in FIG. 4, method 300 can include an optional stage 360 of connecting a dummy load to the intermediate node during a second phase of the jittered clock signal and if the second switch is open. The impedance of the dummy load is substantially equal to an impedance of the intermediate node when the second switch is closed.

FIG. 5 illustrates an analog to digital converter 11 according to an embodiment of the invention.

Analog to digital converter 11 is a second order sigma delta analog converter. It includes a first loop and a second loop. The first loop precedes the second loop and includes current source 30', switch 16', transimpedance circuit 19 and capacitor 14'. Second loop includes current source 30, switch 16, quantizer 18 and capacitor 14. Quantizer 18 switches 16 and 16'.

The output of transimpedance circuit 19 is connected to an input node 12 of the second loop. This input node is connected to switch 16, capacitor 14 and quantizer 18.

Transimpedance circuit (Gm) 19 conveniently does not include an amplifier but includes a transistor (T 70), two switches (SW1 71 and SW2 72) and a capacitor (73). The source of transistor T 70 is connected to one end of SW2 72. An end of SW1 71 is grounded. Capacitor 73 is connected between the ground, another end of SW1 71 and the other end of SW2 72. The drain of transistor T 70 provides an output current Iin 75.

The gate of transistor T 70 receives an input voltage signal (Vin 74) that is converter to a current signal (Iin 75). Switch SW1 71 is closed to discharge capacitor 73 and switch SW2 72 is closed to enable the charging of capacitor 73 via transistor T 70. Conveniently, at any given point of time, at least one switch out of SW1 71 and SW2 72 is open. Iin 75 substantially equals a source drain current that flows through transistor T 70 and is responsive to Vin 74.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:
1. A device, comprising:
    an input node, adapted to receive an analog input current;
    an integrating capacitor; wherein a first end of the integrating capacitor is coupled to the input node;
    a quantizer that comprises a data input, a clock input and an output; wherein the data input is coupled to the input node, the clock input receives a jittered clock signal and the output controls a first switch in response to a voltage level of the input node;
    a fast charge transfer circuit, for transferring to the integrating capacitor a fixed charge if the first switch is closed; wherein the fixed charge is being transferred during a charge transfer period that is substantially shorter than a minimal clock signal phase of the jittered clock signal; and
    the first switch, coupled between the input node and the fast charge transfer circuit.

2. The device according to claim 1 wherein the fast charge transfer circuit comprises a second capacitor coupled to a second switch; wherein the second switch is repetitively opened and closed and the second capacitor receives an alternating signal in synchronism with the jittered clock signal.

3. The device according to claim 1 wherein the fast charge transfer circuit comprises a second capacitor and a second switch;
    wherein a first end of the second capacitor receives an alternating signal that alternates in synchronism with the jittered clock signal;
    wherein a second end of the second capacitor is coupled to an intermediate node located between the first switch and the second switch;
    wherein the second switch is connected between the intermediate node and a voltage supply; and
    wherein the second switch is closed such as to connect the second capacitor to the power supply during a first phase of the jittered clock signal.

4. The device according to claim 3 wherein the alternating signal alternates between a high level that is being provided during a first phase of the jittered clock signal and a low level that is being provided during a second phase of the jittered clock signal.

5. The device according to claim 4 wherein the fast charge transfer gate sends to the integration capacitor, immediately after a transition to the second phase of the jittered clock and if the first switch is closed, a charge that is responsive to the high level of the alternating signal, to the low level of the alternating signal, to a capacitance of the second switch and to a voltage level of the intermediate node.

6. The device according to claim 1 further comprising a dummy load that is coupled to the intermediate node during the second phase of the jittered clock signal if the second switch is open.

7. The device according to claim 6 wherein an impedance of the dummy load is substantially equal to an impedance of the input node.

8. The device according to claim 1 wherein the analog input current represents light detected by an analog pixel.

9. The device according to claim 1 wherein the fast charge transfer circuit transfers to the integrating capacitor a fixed charge during a charge transfer period that is shorter than one half of a minimal clock signal phase of the jittered clock signal.

10. The device according to claim 1 wherein the integrating capacitor, the quantizer, the fast charge transfer circuit and the first switch form a sigma delta analog to digital converter.

11. A method for analog to digital conversion, the comprises:
    providing an analog input current to an integrating capacitor via an input node;
    generating a digital signal that controls a first switch that is coupled between the input node and a fast charge transfer circuit; wherein the generating is responsive to a voltage level of the input node being sampled by a quantizer that is fed by a jittered clock signal;
    transferring, by the fast charge transfer circuit and to the integrating capacitor, a fixed charge if the first switch is closed; wherein the transferring of the fixed charge occurs during a charge transfer period that is substantially shorter than a minimal clock signal phase of the jittered clock signal; and outputting the digital signal.

12. The method according to claim 11 further comprising:

repetitively closing and opening in synchronism to the jittered clock signal, a second switch of the fast charge transfer circuit; and receiving an alternating signal by a second capacitor of the fast charge transfer circuit;

wherein the alternating signal alternates in synchronism with the jittered clock signal.

13. The method according to claim 11 wherein the transferring is preceded by charging a second capacitor of the fast charge transfer circuit to a voltage level determined by a certain level of the alternating signal and by a voltage supply coupled to the second capacitor during the charging.

14. The method according to claim 13 wherein the alternating signal alternates between a high level provided during a first phase of the jittered clock signal and a low level provided during a second phase of the jittered clock signal.

15. The method according to claim 13 wherein the transferring occurs if the first switch is closed and immediately after a transition to the second phase of the jittered clock; and wherein the charge being transferred is responsive to the high level of the alternating signal, to the low level of the alternating signal, to a capacitance of the second switch and to a voltage level of the intermediate node.

16. The method according to claim 12 further comprising coupling a dummy load to the intermediate node during a second phase of the jittered clock signal and if the first switch is open.

17. The method according to claim 16 wherein an impedance of the dummy load is substantially equal to an impedance of the input node.

18. The method according to claim 11 comprising providing an analog input current that represents a light detected by an analog pixel.

19. The method according to claim 11 wherein the transferring occurs during a charge transfer period that is shorter than one half of the minimal clock signal phase of the jittered clock signal.

20. The method according to claim 11 wherein the generating, transferring and outputting are repeated to provide a sigma delta analog to digital conversion process.

21. The device according to claim 1 further comprising a transimpedance circuit that comprises a transistor that is coupled to two switches and a transistor.

* * * * *